(12) United States Patent
Ikeuchi et al.

(10) Patent No.: US 9,472,393 B2
(45) Date of Patent: Oct. 18, 2016

(54) METHOD AND APPARATUS FOR FORMING SILICON OXIDE FILM (71) Applicant: TOKYO ELECTRON LIMITED, Tokyo (JP)

(72) Inventors: Toshiyuki Ikeuchi, Nirasaki (JP); Akira Shimizu, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/623,160

(22) Filed: Feb. 16, 2015

(65) Prior Publication Data

US 2015/0235846 A1 Aug. 20, 2015

(30) Foreign Application Priority Data

Feb. 19, 2014 (JP) .................................. 2014-029085
Nov. 17, 2014 (JP) .................................. 2014-232631

(51) Int. Cl.
*H01L 21/02* (2006.01)
*C23C 16/455* (2006.01)
*C23C 16/52* (2006.01)
*C23C 16/40* (2006.01)

(52) U.S. Cl.
CPC ....... *H01L 21/02164* (2013.01); *C23C 16/402* (2013.01); *C23C 16/45534* (2013.01); *H01L 21/0228* (2013.01); *H01L 21/02211* (2013.01)

(58) Field of Classification Search
CPC H01L 21/02164; C23C 16/40; C23C 16/455
USPC ....................................................... 438/482
See application file for complete search history.

(56) References Cited

U.S. PATENT DOCUMENTS

| | | | | |
|---|---|---|---|---|
| 8,466,049 B2 * | 6/2013 | Inokuchi | ................. | C23C 16/24 257/E21.461 |
| 2003/0236003 A1 * | 12/2003 | Koo | ................... | H01L 21/28518 438/795 |
| 2004/0147130 A1 * | 7/2004 | Mizumura | ........ | H01L 21/31116 438/710 |
| 2004/0209487 A1 * | 10/2004 | Choi | ................. | H01L 21/02164 438/788 |
| 2005/0090123 A1 * | 4/2005 | Nishimura | .......... | C23C 16/4405 438/800 |

(Continued)

FOREIGN PATENT DOCUMENTS

JP 2004-281853 A 10/2004
JP 2006-190787 A 7/2006

(Continued)

*Primary Examiner* — Moazzam Hossain
(74) *Attorney, Agent, or Firm* — Nath, Goldberg & Meyer; Jerald L. Meyer (57) ABSTRACT

A silicon oxide film forming method includes: forming an amorphous silicon film, including: adsorbing an adsorbate containing silicon to a workpiece by supplying a source gas containing chlorine and silicon into a reaction chamber accommodating the workpiece, activating the source gas, and reacting the activated source gas with the workpiece; and removing chlorine contained in the adsorbate by supplying hydrogen gas into the reaction chamber and activating the hydrogen gas, and reacting the activated hydrogen gas with the adsorbate, wherein removing the chlorine is performed after adsorbing the adsorbate is performed, thereby forming the amorphous silicon film on the workpiece; and forming a silicon oxide film on the workpiece by supplying an oxidizing gas into the reaction chamber and oxidizing the amorphous silicon film, wherein forming the amorphous silicon film and forming the silicon oxide film are repeated in this order plural times.

7 Claims, 4 Drawing Sheets

(56) References Cited

U.S. PATENT DOCUMENTS

| | | | | |
|---|---|---|---|---|
| 2006/0213443 | A1* | 9/2006 | Yeom | C23C 16/452 118/723 FI |
| 2007/0066083 | A1* | 3/2007 | Yang | B82Y 10/00 438/764 |
| 2008/0242064 | A1* | 10/2008 | Inokuchi | H01L 21/02046 438/503 |
| 2008/0299747 | A1* | 12/2008 | Arai | C23C 16/24 438/485 |
| 2009/0056619 | A1* | 3/2009 | Mueller | C30B 23/00 117/99 |
| 2009/0104740 | A1* | 4/2009 | Inokuchi | C23C 16/24 438/198 |
| 2011/0124204 | A1* | 5/2011 | Ota | C23C 16/402 438/787 |
| 2012/0000490 | A1* | 1/2012 | Chung | B08B 7/0035 134/22.12 |
| 2012/0228129 | A1* | 9/2012 | Ito | C23C 16/24 204/298.02 |
| 2013/0323914 | A1* | 12/2013 | Liao | H01L 21/02532 438/482 |

FOREIGN PATENT DOCUMENTS

| | | |
|---|---|---|
| JP | 2010-153776 A | 7/2010 |
| JP | 2010-206223 A | 9/2010 |
| JP | 2010-219561 A | 9/2010 |
| JP | 2011-009752 A | 1/2011 |
| JP | 2011-097017 A | 5/2011 |

* cited by examiner

METHOD AND APPARATUS FOR FORMING SILICON OXIDE FILM

CROSS-REFERENCE TO RELATED APPLICATIONS

This application claims the benefit of priority to Japanese Patent Application Nos. 2014-029085 and 2014-232631, respectively filed on Feb. 19 and Nov. 17, 2014, in the Japan Patent Office, the disclosure of which is incorporated herein in their entirety by reference.

TECHNICAL FIELD

The present disclosure relates to a method and apparatus for forming a silicon oxide film.

BACKGROUND

As a method of forming a silicon oxide film, there is proposed atomic layer deposition (ALD) for forming a high-quality silicon oxide film on a workpiece, for example, a semiconductor wafer, at low temperature. For example, a method of forming a thin film at a low temperature of 300 degrees C. to 600 degrees C. is widely known in the art.

As this kind of silicon oxide film, there is a demand for a high-quality silicon oxide film to have high density of Si within its film. Therefore, there is a need for a method of forming a silicon oxide film capable of densifying Si.

SUMMARY

Some embodiments of the present disclosure provide a method and apparatus for forming a silicon oxide film having a high density of Si.

According to one embodiment of the present disclosure, there is provided a silicon oxide film forming method including: forming an amorphous silicon film, including: adsorbing an adsorbate containing silicon to a workpiece by supplying a source gas containing chlorine and silicon into a reaction chamber accommodating the workpiece, activating the source gas, and reacting the activated source gas with the workpiece; and removing chlorine contained in the adsorbate by supplying hydrogen gas into the reaction chamber and activating the hydrogen gas, and reacting the activated hydrogen gas with the adsorbate, wherein removing the chlorine is performed after adsorbing the adsorbate is performed, thereby forming the amorphous silicon film on the workpiece; and forming a silicon oxide film on the workpiece by supplying an oxidizing gas into the reaction chamber and oxidizing the amorphous silicon film, wherein forming the amorphous silicon film and forming the silicon oxide film are repeated in this order plural times.

According to another embodiment of the present disclosure, there is provided an apparatus for forming a silicon oxide film, including: a reaction chamber configured to accommodate a workpiece; a source gas supply unit configured to supply a source gas containing chlorine and silicon into the reaction chamber; a hydrogen gas supply unit configured to supply hydrogen gas into the reaction chamber; an oxidizing gas supply unit configured to supply an oxidizing gas into the reaction chamber; and a controller configured to control the respective units of the apparatus, wherein the controller controls the source gas supply unit to supply the source gas into the reaction chamber such that an adsorbate containing silicon is adsorbed to the workpiece accommodated in the reaction chamber, and controls the hydrogen gas supply unit to supply the hydrogen gas into the reaction chamber such that chlorine contained in the adsorbate is removed, thereby forming an amorphous silicon film on the workpiece, wherein the controller controls the oxidizing gas supply unit to supply the oxidizing gas into the reaction chamber such that the silicon amorphous silicon film is oxidized, thereby forming a silicon oxide film on the workpiece, wherein the controller repeats forming the amorphous silicon film and forming the silicon oxide film plural times.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
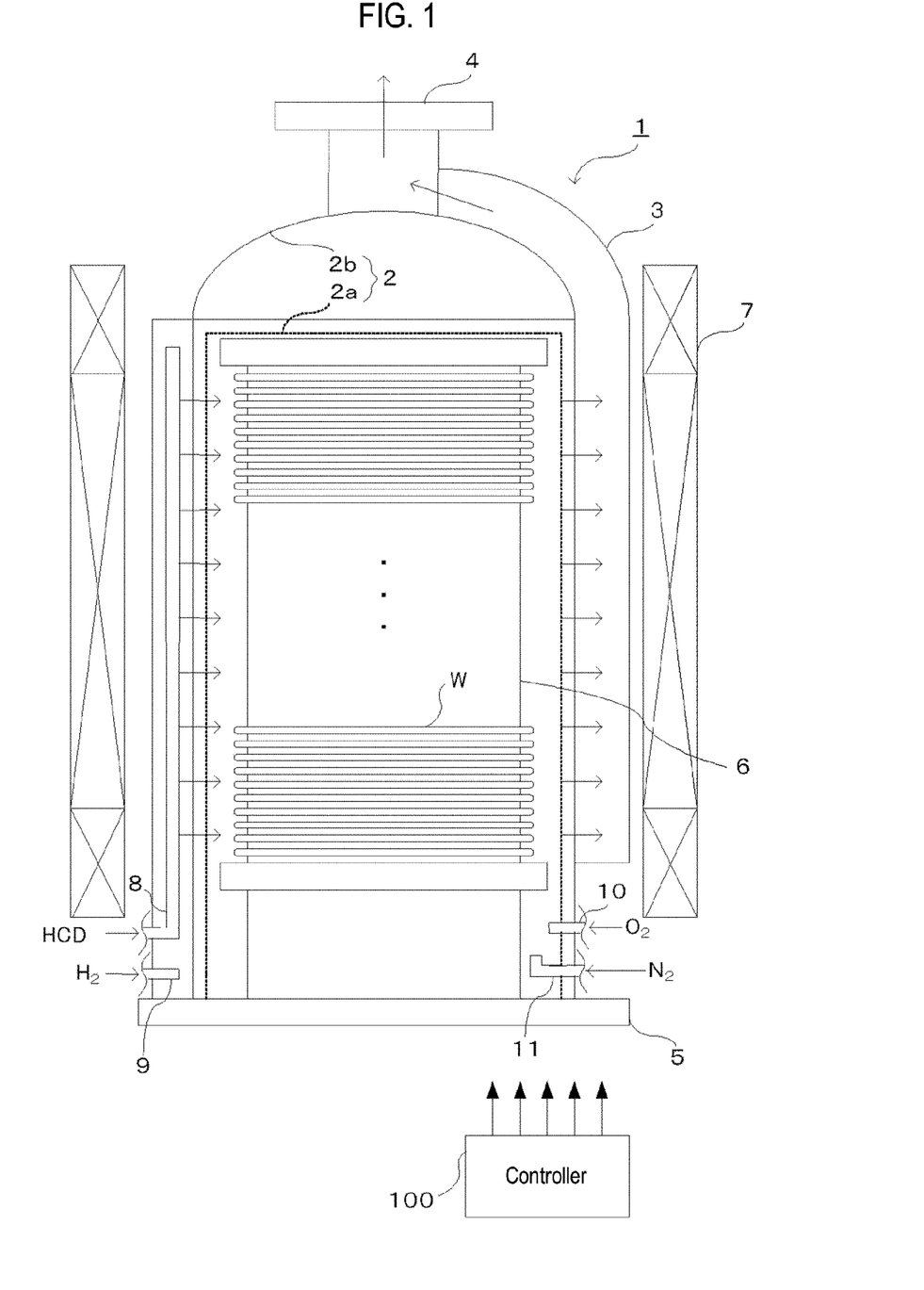
FIG. 1 is a view showing a processing apparatus according to one embodiment of the present disclosure.

A method and apparatus for forming a silicon oxide film according to some embodiments of the present disclosure will now be described in detail. In the present embodiments, the description will be given by way of example in which a batch-type vertical processing apparatus is used as the apparatus for forming a silicon oxide film according to the embodiments of the present disclosure. FIG. 1 shows the configuration of the processing apparatus according to one embodiment.

Referring to FIG. 1, the processing apparatus 1 includes a reaction tube 2 that extends in a longitudinal direction, which is the vertical direction. The reaction tube 2 has a double tube structure which includes an inner tube 2a and a roofed outer tube 2b configured to cover the inner tube 2a and separated a predetermined distance from the inner tube 2a. Sidewalls of the inner tube 2a and the outer tube 2b have a plurality of openings as indicated by arrows in FIG. 1. The inner tube 2a and the outer tube 2b are made of a material having excellent heat resistance and corrosion resistance, for example, quartz.

The reaction tube 2 is provided at one side thereof with an exhaust unit 3 that exhausts gas from the reaction tube 2. The exhaust unit 3 extends upward along the reaction tube 2 and communicates with the reaction tube 2 through the openings formed in the sidewall of the reaction tube 2. The exhaust unit 3 is connected at an upper end thereof to an exhaust port 4 arranged at an upper portion of the reaction tube 2. An exhaust pipe (not shown) is connected to the exhaust port 4. Pressure regulating mechanisms such as a valve (not shown) and a vacuum pump 127 described below are disposed in the exhaust pipe. By virtue of the pressure regulating mechanisms, a gas supplied from the sidewall of one side of the outer tube 2b (a source gas supply pipe 8) is exhausted to the exhaust pipe through the inner tube 2a, the sidewall of the other side of the outer tube 2b, the exhaust unit 3, and the exhaust port 4. Thus, the interior of the reaction tube 2 is controlled to a desired pressure (vacuum degree).

A lid 5 is disposed under the reaction tube 2. The lid 5 is made of a material having excellent heat resistance and corrosion resistance, for example, quartz. The lid 5 may be moved up and down by a boat elevator 128 described below. When the lid 5 is moved up by the boat elevator 128, a lower end (furnace port) of the reaction tube 2 is closed. When the lid 5 is moved down by the boat elevator 128, the lower end (furnace port) of the reaction tube 2 is open.

A wafer boat 6 is loaded on the lid 5. The wafer boat 6 is made of, for example, quartz. The wafer boat 6 is configured to accommodate a plurality of semiconductor wafers W such that the plural semiconductor wafers W are separated a predetermined distance from each other in the vertical direction. Furthermore, a heat insulating container or a rotary table may be disposed on the lid 5, and the wafer boat 6 may be mounted thereon. The heat insulating container prevents reduction in internal temperature of the reaction tube 2 at the furnace port of the reaction tube 2 and the wafer boat 6 for accommodating the semiconductor wafers W may be rotatably loaded on the rotary table. In this case, it is easy to control the semiconductor wafers W accommodated within the wafer boat 6 at the uniform temperature.

In the vicinity of the reaction tube 2, temperature rising heaters 7, for example, consisting of resistive heating elements, are disposed so as to surround the reaction tube 2. The interior of the reaction tube 2 is heated to a predetermined temperature by the temperature rising heaters 7. As a result, the semiconductor wafers W accommodated within the reaction tube 2 are heated to a predetermined temperature.

The source gas supply pipe 8 for supplying a source gas into the reaction tube 2 (the outer tube 2b) is inserted into the reaction tube 2 through a side surface near the lower end of the reaction tube 2. The source gas is a Si source which supplies a source material (Si) to be adsorbed to a workpiece. The source gas is used in an adsorption step described below. Examples of the Si source may include a gas containing chlorine (Cl) and silicon (Si), for example, hexachlorodisilane (HCD: $Si_2Cl_6$), octachlorotrisilane ($Si_3Cl_8$), and tetrachlorosilane ($SiCl_4$). In this example, HCD is used as the Si source.

A plurality of supply holes is formed in the source gas supply pipe 8 to be arranged at certain intervals in the vertical direction. The source gas is supplied into the reaction tube 2 (the outer tube 2b) through the supply holes. Thus, as indicated by arrows in FIG. 1, the source gas is supplied into the reaction tube 2 from a plurality of points arranged in the vertical direction.

A hydrogen gas supply pipe 9 for supplying hydrogen ($H_2$) gas into the reaction tube 2 (the outer tube 2b) is inserted into the reaction tube 2 through the side surface near the lower end of the reaction tube 2. The hydrogen gas is a gas which removes chlorine from the adsorbed source to form amorphous silicon (a-Si) film. The hydrogen gas is used in a chlorine removal step described below.

An oxidizing gas supply pipe 10 for supplying an oxidizing gas into the reaction tube 2 (the outer tube 2b) is inserted into the reaction tube 2 through the side surface near the lower end of the reaction tube 2. The oxidizing gas is a gas which oxidizes the a-Si film. The oxidizing gas is used in an oxidation process described below. Examples of the oxidizing gas may include hydrogen ($H_2$)+oxygen ($O_2$), $O_2$ plasma, and oxygen radicals used in $O_3$ treatment or the like, in addition to oxygen ($O_2$), ozone ($O_3$), nitrogen oxide (NO), dinitrogen monoxide ($N_2O$). In this example, oxygen ($O_2$) is used as the oxidizing gas.

A nitrogen gas supply pipe 11 for supplying nitrogen ($N_2$) as a diluting gas and a purge gas into the reaction tube 2 (the outer tube 2b) is inserted into the reaction tube 2 through the side surface near the lower end of the reaction tube 2.

The source gas supply pipe 8, the hydrogen gas supply pipe 9, the oxidizing gas supply pipe 10, and the nitrogen gas supply pipe 11 are connected to gas supply sources (not shown) through MFCs (Mass Flow Controllers) 125 described below.

A plurality of temperature sensors 122, for example, consisting of thermocouples, for measuring the internal temperature of the reaction tube 2 and a plurality of pressure gauges 123 for measuring the internal pressure of the reaction tube 2 are disposed within the reaction tube 2.

Figure 2:
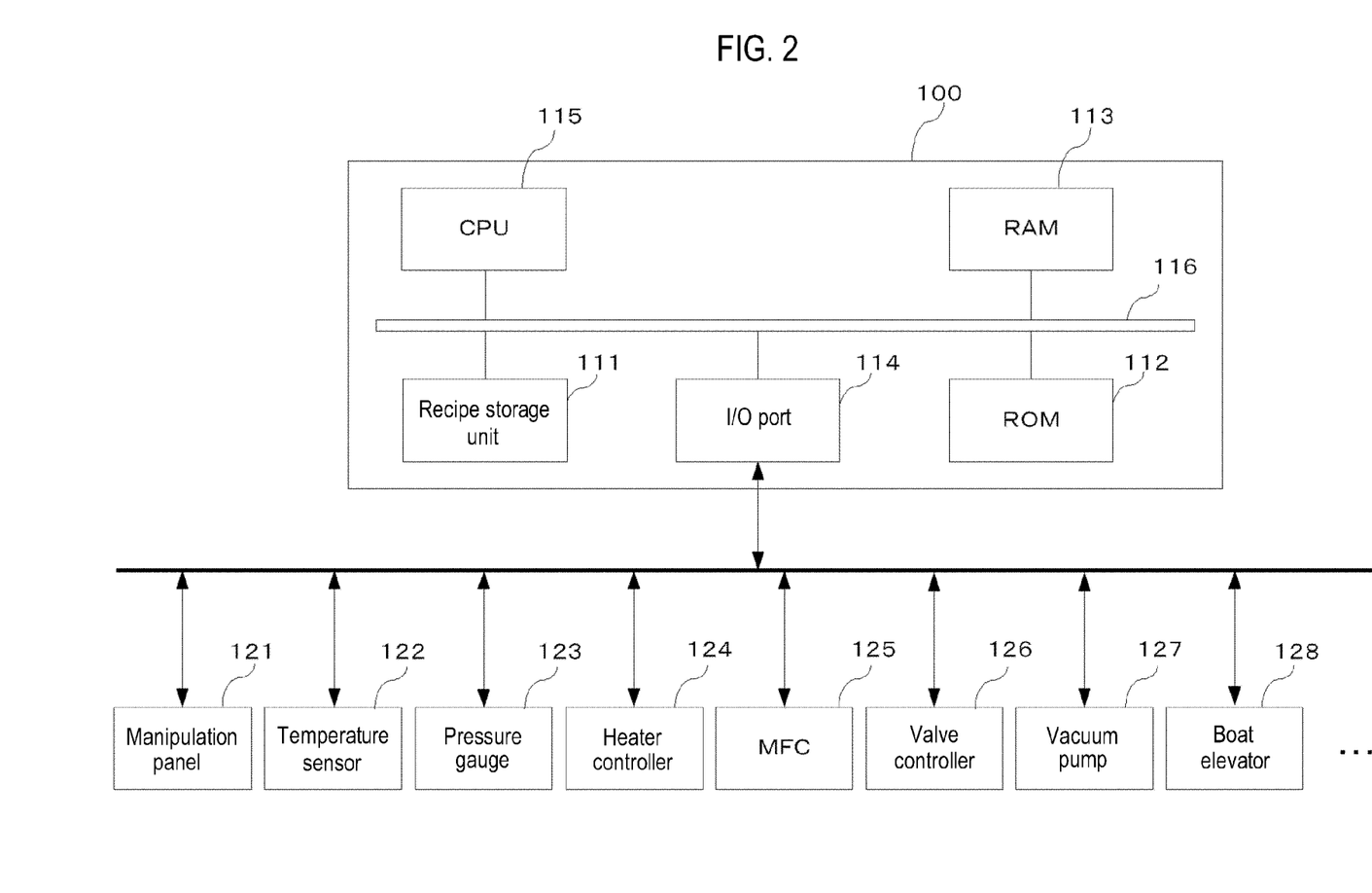
FIG. 2 is a view showing a configuration of a controller shown in FIG. 1.

The processing apparatus 1 further includes a controller 100 configured to control the respective components of the apparatus. FIG. 2 shows the configuration of the controller 100. As shown in FIG. 2, a manipulation panel 121, the temperature sensors 122, the pressure gauges 123, a heater controller 124, the MFCs 125, valve controllers 126, the vacuum pump 127, the boat elevator 128 and the like are connected to the controller 100.

The manipulation panel 121 is provided with a display and manipulation buttons. The manipulation panel 121 transmits operating instructions to the controller 100 and displays a variety of information received from the controller 100 on the display thereof.

The temperature sensors 122 measure the temperatures of the respective components within the reaction tube 2, the exhaust pipe, etc., and notify the controller 100 of the measured values.

The pressure gauges 123 measure the pressures of the respective components within the reaction tube 2, the exhaust pipe, etc., and notify the controller 100 of the measured values.

The heater controller 124 individually controls the temperature rising heaters 7. In response to instructions received from the controller 100, the heater controller 124 allows supply of electric current to the temperature rising heaters 7 to heat the temperature rising heaters 7. Moreover, the heater controller 124 measures power consumption of the respective temperature rising heaters 7 and notifies the controller 100 of the measured values.

The respective MFCs 125 are disposed in the pipes such as the source gas supply pipe 8, the hydrogen gas supply pipe 9, the oxidizing gas supply pipe 10, and the nitrogen gas supply pipe 11. The MFCs 125 control flow rates of gases flowing through the respective pipes at rates instructed by the controller 100. At the same time, the MFCs 125 measure the actual flow rates of the gases and notify the controller 100 of the measured flow rates.

The valve controllers 126 are disposed in the respective pipes and control the opening degrees of the valves disposed in the respective pipes at the values instructed by the controller 100.

The vacuum pump 127 is connected to the exhaust pipe and exhausts the gas present within the reaction tube 2.

The boat elevator 128 moves the lid 5 upward to load the wafer boat 6 (the semiconductor wafers W) into the reaction tube 2. The boat elevator 128 moves the lid 5 downward to unload the wafer boat 6 (the semiconductor wafers W) from the interior of the reaction tube 2.

The controller 100 includes a recipe storage unit 111, a read only memory (ROM) 112, a random access memory (RAM) 113, an input/output (I/O) port 114, a central processing unit (CPU) 115, and a bus 116 interconnecting these components to one another.

A setup recipe and a plurality of process recipes are stored in the recipe storage unit 111. In the beginning of manufacture of the processing apparatus 1, only the setup recipe is stored in the recipe storage unit 111. The setup recipe is executed to generate thermal models and the like for individual processing apparatuses. The process recipe is prepared for each heat treatment (process) actually performed by a user. Each of the process recipes regulates temperature changes of the respective components, pressure changes within the reaction tube 2, and supply start/stop timings and supply amounts of various types of gases, during the time period from when the semiconductor wafers W are loaded into the reaction tube 2 to when the processed semiconductor wafers W are unloaded from the reaction tube 2.

The ROM 112 is constituted by an electrically erasable programmable read only memory (EEPROM), a flash memory, a hard disk or the like. The ROM 112 is a recording medium that stores an operation program of the CPU 115 and the like.

The RAM 113 serves as a work area of the CPU 115.

The I/O port 114 is connected to the manipulation panel 121, the temperature sensors 122, the pressure gauges 123, the heater controller 124, the MFCs 125, the valve controllers 126, the vacuum pump 127, the boat elevator 128, and the like. The I/O port 114 controls the input and output of data or signals.

The CPU 115 constitutes a core of the controller 100 and executes operation programs stored in the ROM 112. In response to instructions received through the manipulation panel 121, the CPU 115 controls operation of the processing apparatus 1 according to the recipes (process recipes) stored in the recipe storage unit 111. That is to say, the CPU 115 allows the temperature sensors 122, the pressure gauges 123, the MFCs 125, etc., to measure the temperatures, pressures, flow rates, etc. of the respective components within the reaction tube 2, the exhaust pipe, etc. Based on the measurement data, the CPU 115 outputs control signals to the heater controller 124, the MFCs 125, the valve controllers 126, the vacuum pump 127 and the like, thereby controlling the respective components to follow the process recipes.

The bus 116 delivers information between the respective components.

Next, a method of forming a silicon oxide film using the processing apparatus 1 configured as above will be described with reference to the recipe (time sequence) shown in FIG. 3. In the method of forming a silicon oxide film according to the present embodiment, a silicon oxide film is formed on a semiconductor wafer W by ALD.

Figure 3:
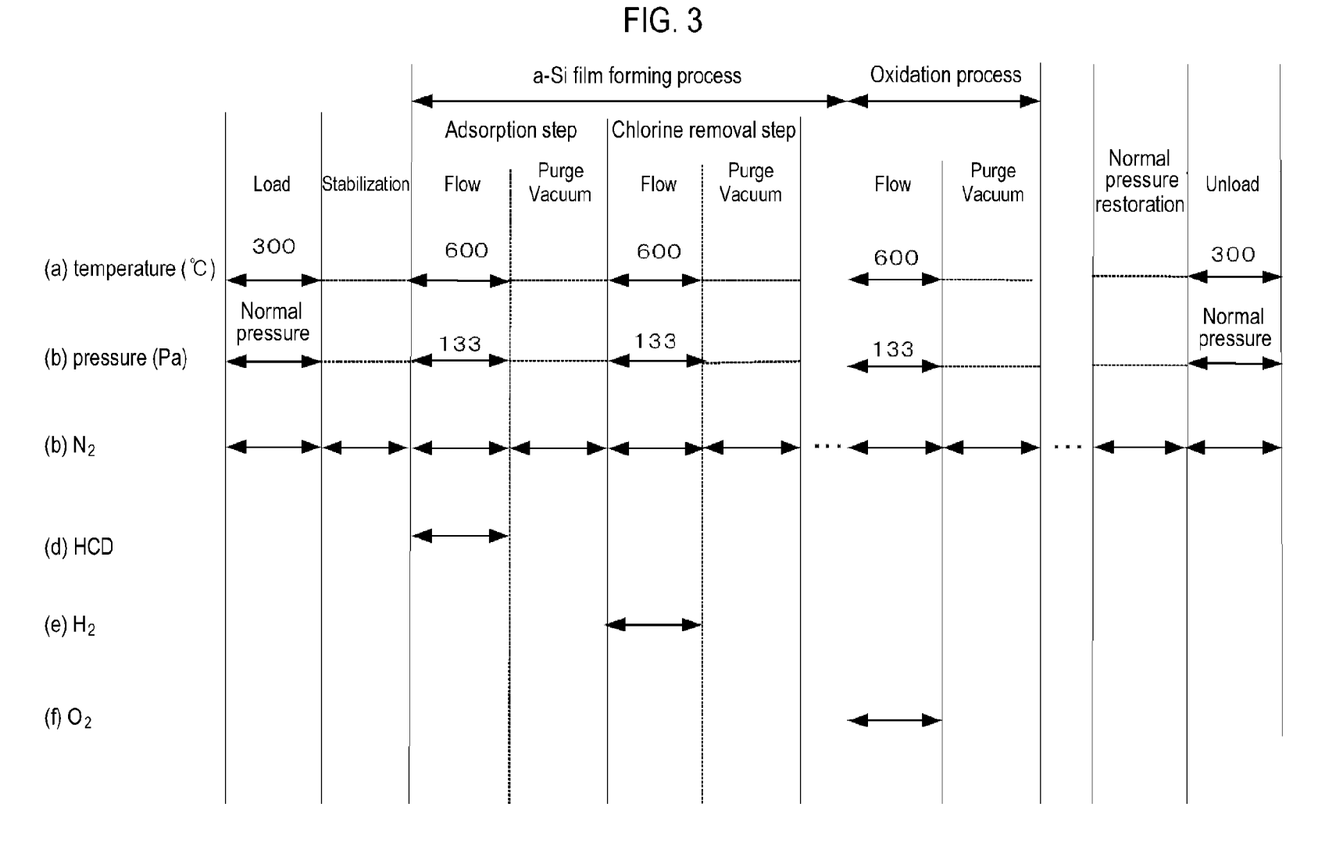
FIG. 3 is a view explaining a method of forming a silicon oxide film according to one embodiment of the present disclosure.

Referring to FIG. 3, ALD according to one embodiment of the present disclosure includes: an a-Si film forming process for forming an amorphous silicon (a-Si) film by repeating an adsorption step for adsorbing a source (Si) to a semiconductor wafer W and a chlorine removal step for removing chlorine (Cl) from the adsorbed source plural times; and a oxidation process for oxidizing the formed a-Si film (forming a silicon oxide film). The a-Si film forming process and the oxidation process are performed (repeated) plural times, for example, one hundred times, whereby a silicon oxide film having a desired thickness is formed on the semiconductor wafer W. In addition, in this embodiment, as shown in FIG. 3, hexachlorodisilane (HCD), hydrogen ($H_2$), oxygen ($O_2$), and nitrogen ($N_2$) are used as a Si source gas, hydrogen gas, an oxidizing gas, and a diluting gas, respectively.

In the following description, operations of the respective components constituting the processing apparatus 1 are controlled by the controller 100 (the CPU 115). The controller 100 (the CPU 115) controls the heater controller 124 (the temperature rising heaters 7), the MFCs 125 (the source gas supply pipe 8 and the like), the valve controllers 126, and the vacuum pump 127 in the aforementioned manner, such that the temperature, pressure, flow rates of gases, etc. in the reaction tube 2 in the respective processes are set to conditions conforming to the recipe shown in FIG. 3.

First, the interior of the reaction tube 2 is maintained at a predetermined load temperature, for example, 300 degrees C., by the temperature rising heaters 7, as shown in (a) of FIG. 3. Then, the wafer boat 6 accommodating the semiconductor wafers W is loaded onto the lid 5. The lid 5 is moved up by the boat elevator 128, thereby loading the semiconductor wafers W (the wafer boat 6) into the reaction tube 2 (load process).

Subsequently, the adsorption step for adsorbing a source to the semiconductor wafer W is performed. First, the interior of the reaction tube 2 is set at a predetermined temperature, for example, 600 degrees C. as shown in (a) of FIG. 3, using the temperature rising heaters 7. Further, a specific amount of nitrogen is supplied from the nitrogen gas supply pipe 11 into the reaction tube 2 while discharging the gas within the reaction tube 2. Thus, the reaction tube 2 is set to a predetermined pressure, for example, 133 Pa (1 Torr), as shown in (b) of FIG. 3 (stabilization process).

In this regard, the internal temperature of the reaction tube 2 may range from 500 degrees C. to 700 degrees C., or from 550 degrees C. to 650 degrees C. These temperature ranges can improve the film quality of the formed silicon oxide film, the uniformity of the film thickness, etc.

The internal pressure of the reaction tube 2 may range from 0.133 Pa (0.001 Torr) to 13.3 kPa (100 Torr) in some embodiments. This pressure range can accelerate the reaction of Si with the semiconductor wafer W. The internal pressure of the reaction tube 2 , in some embodiments, may range from 133 Pa (1 Torr) to 1330 Pa (10 Torr). That is because this pressure range can make it easier to control the internal pressure of the reaction tube 2.

Subsequently, the a-Si film forming process for forming an amorphous Si (a-Si) film on the semiconductor wafer W is performed. The a-Si film forming process includes the adsorption step for adsorbing Si to the semiconductor wafer W and the chlorine removal step for removing chlorine (Cl) from the adsorbed source on the semiconductor wafer W. The adsorption step and the chlorine removal step are repeated plural times, whereby the a-Si film is formed on the semiconductor wafer W.

First, the adsorption step is performed. In the adsorption step, a specific amount of HCD is supplied as a Si source from the source gas supply pipe 8 into the reaction tube 2, as shown in (d) of FIG. 3, and a predetermined amount of nitrogen is supplied from the nitrogen gas supply pipe 11 into the reaction tube 2, as shown in (c) of FIG. 3 (flow process).

HCD supplied into the reaction tube 2 is heated and activated within the reaction tube 2. For this reason, upon supplying HCD into the reaction tube 2, the activated Si reacts with the semiconductor wafer W and is adsorbed to the semiconductor wafer W.

When a predetermined amount of Si is adsorbed to the semiconductor wafer W, supply of HCD from the source gas supply pipe 8 and supply of nitrogen from the nitrogen gas supply pipe 11 are stopped. Then, for example, as shown in (c) of FIG. 3, a specific amount of nitrogen is supplied from the nitrogen gas supply pipe 11 into the reaction tube 2 such that the gas within the reaction tube 2 is discharged outside of the reaction tube 2 (purge/vacuum process).

Subsequently, the chlorine removal step is performed. In the chlorine removal step, first, the internal temperature of the reaction tube 2 is set to a predetermined temperature, for example, 600 degrees C. as shown in (a) of FIG. 3, using the temperature rising heaters 7. Further, a specific amount of nitrogen is supplied from the nitrogen gas supply pipe 11 into the reaction tube 2 while discharging the gas from the reaction tube 2. Thus, the internal pressure of the reaction tube 2 is set to a predetermined pressure, for example, 133 Pa (1 Torr), as shown in (b) of FIG. 3. Then, a specific amount of hydrogen gas is supplied from the hydrogen gas supply pipe 9 into the reaction tube 2, as shown in (e) of FIG. 3, and a predetermined amount of nitrogen is supplied from the nitrogen gas supply pipe 11 into the reaction tube 2, as shown in (c) of FIG. 3 (flow process).

Hydrogen supplied into the reaction tube 2 is heated and activated within the reaction tube 2. For this reason, upon supplying hydrogen into the reaction tube 2, the activated hydrogen severs Si—Cl bonds of the adsorbed Si to remove chlorine from the adsorbed source.

In this regard, a process of supplying hydrogen radicals into the reaction tube 2 is considered as a method of removing chlorine from the adsorbed source. However, the removal of chlorine with hydrogen radicals causes not only Si—Cl bonds of the adsorbed Si but also Si—Si bonds thereof to be severed. Thus, an amorphous silicon (a-Si) film containing a large amount of hydrogen (H) is formed on the semiconductor wafer W, which disrupts densification of Si. Accordingly, hydrogen gas is used to remove chlorine from the adsorbed source.

When chlorine is removed from the adsorbed source, supply of hydrogen gas from the hydrogen gas supply pipe 9 and supply of nitrogen from the nitrogen gas supply pipe 11 are stopped. Then, for example, as shown in (c) of FIG. 3, a specific amount of nitrogen is supplied from the nitrogen gas supply pipe 11 into the reaction tube 2 such that the gas within the reaction tube 2 is discharged from the reaction tube 2 (purge/vacuum process).

As a result, an amorphous silicon (a-Si) film is formed on the semiconductor wafer W. Subsequently, the adsorption step and the chlorine removal step are repeated a predetermined number of times. Consequently, an a-Si film having a desired thickness is formed on the semiconductor wafer W (a-Si film forming process).

Subsequently, the process for oxidizing the formed a-Si film (for forming a silicon oxide film) is performed. First, in the oxidation process, the internal temperature of the reaction tube 2 is set to a predetermined temperature, for example, 600 degrees C., using the temperature raising heaters 7, as shown in (a) of FIG. 3. Further, a specific amount of nitrogen is supplied from the nitrogen gas supply pipe 11 into the reaction tube 2 while discharging the gas from the reaction tube 2. Thus, the internal pressure of the reaction tube 2 is set to a predetermined pressure, for example, 133 Pa (1 Torr), as shown in (b) of FIG. 3. Then, a specific amount of oxygen gas is supplied from the oxidizing gas supply pipe 10 into the reaction tube 2, as shown in (f) of FIG. 3, and a predetermined amount of nitrogen is supplied from the nitrogen gas supply pipe 11 into the reaction tube 2, as shown in (c) of FIG. 3 (flow process).

Oxygen supplied into the reaction tube 2 is heated and activated within the reaction tube 2. For this reason, upon supplying oxygen into the reaction tube 2, the formed a-Si film is oxidized. As a result, a silicon oxide film ($SiO_2$) film is formed on the semiconductor wafer W.

When the silicon oxide film ($SiO_2$) film is formed on the semiconductor wafer W, supply of oxygen gas from the oxidizing gas supply pipe 10 and supply of nitrogen from the nitrogen gas supply pipe 11 are stopped. Then, for example, as shown in (c) of FIG. 3, a specific amount of nitrogen is supplied from the nitrogen gas supply pipe 11 into the reaction tube 2 such that the gas within the reaction tube 2 is discharged from the reaction tube 2(purge/vacuum process).

Accordingly, one cycle of ALD including the a-Si film forming process and the oxidation process is finished. Subsequently, another cycle of ALD may be started from the adsorption step in the a-Si film forming process, and such a cycle may be repeated a predetermined number of times. In this manner, a silicon oxide film having a desired thickness is formed on the semiconductor wafer W.

When the silicon oxide film having a desired thickness is formed on the semiconductor wafer W, the interior of the reaction tube 2 is maintained at a predetermined loading temperature, for example, 300 degrees C., using the temperature raising heaters 7, as shown in (a) of FIG. 3, while supplying a specific amount of nitrogen from the nitrogen gas supply pipe 10 into the reaction tube 2, such that the interior of the reaction tube 2 is cycle-purged with $N_2$ to be returned to normal pressure (normal pressure restoration process). Then, the lid 5 is moved down by the boat elevator 128, thereby unloading the semiconductor wafers W (unloading process).

As such, the processes of adsorbing HCD to the semiconductor wafer W, supplying hydrogen, removing chlorine from the adsorbed source and forming the a-Si film are performed plural times, whereby densification of Si can be accomplished without relying on adsorption sites. On the other hand, in a conventional method of adsorbing a Si source to a surface of a semiconductor wafer W, since Si is adsorbed only to adsorption sites of the surface to be adsorbed, densification of Si is impossible.

In order to confirm effects of the present disclosure, with the method of forming a silicon oxide film as set forth above, a 100 nm thick silicon oxide film was formed on a semiconductor wafer W, followed by measuring Si density of the silicon oxide film. The measured value was 2.30 $g/cm^3$ or higher. For comparison, a 100 nm thick silicon oxide film was formed by the conventional method, followed by measuring Si density of the silicon oxide film. The measured value was about 2.25 $g/cm^3$. Therefore, it was ascertained that the method of forming a silicon oxide film of the present embodiment could realize densification of Si.

As described above, according to the present embodiment, the processes of adsorbing HCD to a semiconductor wafer W, supplying hydrogen, and forming an a-Si film through removal of chlorine from the adsorbed source are performed plural times, and then oxygen is supplied to the a-Si film to form a silicon oxide film on the semiconductor wafer W through oxidation of the a-Si film, whereby the density of Si in the silicon oxide film can be increased.

The present disclosure is not limited to the aforementioned embodiment but may be modified and applied in many different forms. Hereinafter, other embodiments applicable to the present disclosure will be described.

Figure 4:
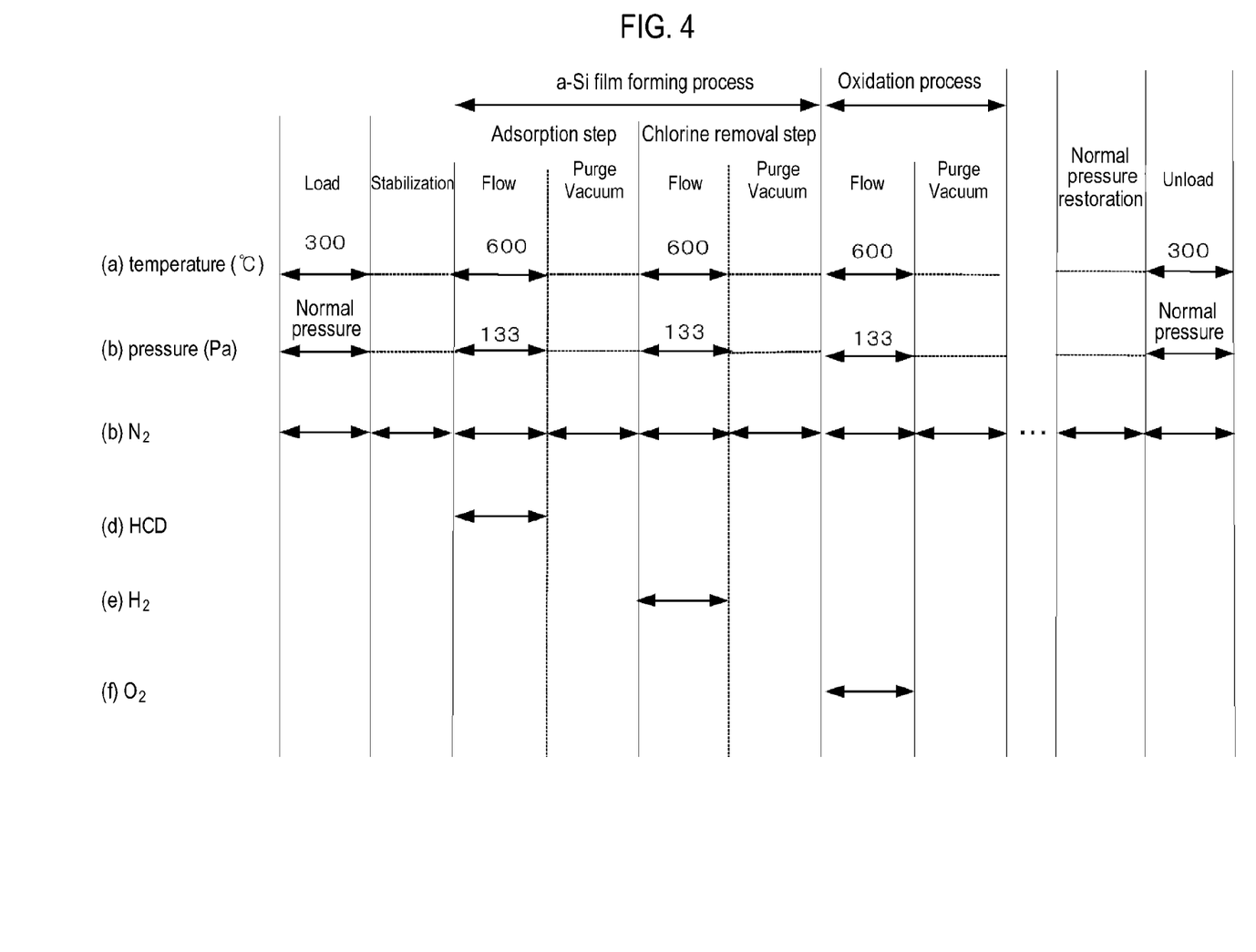
FIG. 4 is a view explaining a method of forming a silicon oxide film according to another embodiment of the present disclosure.

In the aforementioned embodiment, the present disclosure has been described by way of example wherein the processes of adsorbing HCD to a semiconductor wafer W, supplying hydrogen and forming an a-Si film through removal of chlorine from the adsorbed source are performed plural times. However, the oxidation process may be performed without repeating the a-Si film forming process plural times, for example, as shown in FIG. 4. Even in this case, the density of Si in the formed silicon oxide film can be increased.

In the aforementioned embodiment, the present disclosure has been described by way of example wherein HCD is used as the Si source. However, the Si source may be a gas containing chlorine (Cl) and silicon (Si), for example, octachlorotrisilane ($Si_3Cl_8$), and tetrachlorosilane ($SiCl_4$).

In the aforementioned embodiment, the present disclosure has been described by way of example wherein oxygen is used as the oxidizing gas. However, the oxidizing gas may be any gas capable of substituting Si—O groups for Si—H groups having been adsorbed to the semiconductor wafer W, after the chlorine removal step. For example, nitrogen oxide (NO) or dinitrogen monoxide ($N_2O$) may be used as the oxidizing gas.

In particular, oxygen radicals may be used as the oxidizing gas in that the oxygen radicals have higher oxidation power than oxygen, whereby the densified Si can be entirely oxidized by the oxygen radicals even when all of the densified Si cannot be oxidized by oxygen.

For example, while the internal pressure of the reaction tube 2 is maintained at 1330 Pa (10 Torr) or less, $H_2+O_2$ are supplied into the reaction tube 2. The flow rate of $H_2$ is controlled in an amount of 5% to 90% based on the total flow rate of $H_2$ and $O_2$. As such, oxygen radicals may be used as the oxidizing gas. In addition, oxygen radicals generated by oxygen ($O_2$) plasma treatment, ozone ($O_3$) treatment, or the like may be used as the oxidizing gas.

In the aforementioned embodiment, the present disclosure has been described by way of example wherein the internal temperature of the reaction tube 2 is set to 600 degrees C. However, the interior of the reaction tube 2 may be set to a low temperature by activating the process gas using catalysts, ultraviolet light, magnetic forces or the like.

In the aforementioned embodiment, assuming that one cycle is composed of an a-Si forming process and an oxidation process, the present disclosure has been described by way of example wherein this cycle was repeated one hundred times. As an alternative example, the number of cycles may be reduced to, for example, fifty cycles. Moreover, the number of cycles may be increased to, for example, two hundred cycles. Even in these cases, densification of Si in the formed silicon oxide film may be accomplished by adjusting, for example, the supply amount of the Si source depending upon the number of cycles. In addition, for example, in the a-Si forming process, the number of execution times of the chlorine removal step may be controlled in such a way that the chlorine removal step is omitted for the first ten times and started from the eleventh, thereby adjusting the film quality of the silicon oxide film.

In the aforementioned embodiment, the present disclosure has been described by way of example wherein the silicon oxide film is formed on the semiconductor wafer W through ALD. However, the present disclosure is not limited to ALD. Alternatively, a silicon oxide film may be formed on the semiconductor wafer W through chemical vapor deposition (CVD).

In the aforementioned embodiment, the present disclosure has been described by way of example wherein nitrogen is supplied as a diluting gas during supply of the process gas, such as HCD. Alternatively, the nitrogen may not be supplied during supply of the process gas. However, since it is easy to set the processing time and the like when nitrogen is supplied as the diluting gas, it may be preferable to supply the diluting gas. The diluting gas may be an inert gas other than the nitrogen, for example, helium (He), neon (Ne), argon (Ar), krypton (Kr) or xenon (Xe).

In the aforementioned embodiment, the present disclosure has been described by way of example wherein the batch-type processing apparatus having a double tube structure is used as the processing apparatus 1. As an alternative example, the present disclosure may be applied to a batch-type processing apparatus having a single tube structure. Moreover, the present disclosure may be applied to a batch-type horizontal processing apparatus or a single-substrate-type processing apparatus.

The controller 100 employed in the embodiments of the present disclosure may be realized using a typical computer system instead of a dedicated computer system. For example, the controller 100 for performing the aforementioned processes may be configured by installing programs for executing processes into a general-purpose computer through a recording medium (a flexible disk, a compact disc-read only memory (CD-ROM), or the like) which stores the programs for performing the aforementioned processes.

The programs may be provided by arbitrary means. The programs may be provided not only by the recording medium mentioned above but also through a communication line, a communication network, a communication system or the like. In the latter case, the programs may be posted on bulletin boards (BBSs: Bulletin Board Systems) and provided through a network. The program thus provided is executed in the same manner as other application programs under the control of an operating system, thereby performing the processes described above.

The present disclosure is useful in any method and apparatus for forming a silicon oxide film.

According to the present disclosure, it is possible to provide a method and apparatus for forming a silicon oxide film having a high density of Si.

While certain embodiments have been described, these embodiments have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A silicon oxide film forming method, comprising:
    forming an amorphous silicon film, including:
        adsorbing an adsorbate containing silicon to a workpiece by supplying a source gas containing chlorine and silicon into a reaction chamber accommodating the workpiece, activating the source gas, and reacting the activated source gas with the workpiece; and removing chlorine contained in the adsorbate by supplying hydrogen gas into the reaction chamber and activating the hydrogen gas by heating the hydrogen gas within the reaction chamber, and reacting the activated hydrogen gas with the adsorbate, such that a chlorine and silicon bond in the adsorbate is severed to remove the chlorine in the adsorbate leaving the silicon in the adsorbate, thereby forming the amorphous silicon film, wherein removing the chlorine is performed after adsorbing the adsorbate is performed, thereby forming the amorphous silicon film on the workpiece; and forming a silicon oxide film on the workpiece by supplying an oxidizing gas into the reaction chamber and oxidizing the amorphous silicon film, wherein forming the amorphous silicon film and forming the silicon oxide film are repeated in this order plural times.

2. The method of claim 1, wherein forming the amorphous silicon film includes adsorbing the adsorbate and removing the chlorine that are repeated in this order plural times.

3. The method of claim 1, wherein adsorbing the adsorbate uses hexachlorodisilane, octachlorotrisilane, or tetrachlorosilane as the source gas.

4. The method of claim 1, wherein forming the silicon oxide film uses oxygen radicals as the oxidizing gas.

5. The method of claim 1, wherein forming the silicon oxide film uses oxygen, nitrogen oxide, or dinitrogen monoxide as the oxidizing gas.

6. The method of claim 1, wherein removing the chlorine sets an internal temperature of the reaction chamber at 500 degrees C. to 650 degrees C.

7. An apparatus for forming a silicon oxide film, comprising:

a reaction chamber configured to accommodate a workpiece;

a source gas supply unit configured to supply a source gas containing chlorine and silicon into the reaction chamber;

a hydrogen gas supply unit configured to supply hydrogen gas into the reaction chamber;

an oxidizing gas supply unit configured to supply an oxidizing gas into the reaction chamber; and a controller configured to control the respective units of the apparatus, wherein the controller controls the source gas supply unit to supply the source gas into the reaction chamber such that an adsorbate containing silicon is adsorbed to the workpiece accommodated in the reaction chamber, and controls the hydrogen gas supply unit to supply the hydrogen gas into the reaction chamber, the controller controls a temperature of the reaction chamber to a predetermined temperature at which the hydrogen gas is heated and activated such that a chlorine and silicon bond in the adsorbate is severed by the heated and activated hydrogen gas to remove the chlorine in the adsorbate leaving the silicon in the adsorbate, thereby forming an amorphous silicon film on the workpiece, wherein the controller controls the oxidizing gas supply unit to supply the oxidizing gas into the reaction chamber such that the silicon amorphous silicon film is oxidized, thereby forming a silicon oxide film on the workpiece, wherein the controller repeats forming the amorphous silicon film and forming the silicon oxide film plural times.

* * * * *